(12) United States Patent
Schneider et al.

(10) Patent No.: US 7,746,135 B2
(45) Date of Patent: Jun. 29, 2010

(54) WAKE-UP CIRCUIT

(75) Inventors: Jacob S. Schneider, Austin, TX (US); Navneet Dour, Folsom, CA (US); Harishankar Sridharan, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 171 days.

(21) Appl. No.: 11/864,923

(22) Filed: Sep. 29, 2007

(65) Prior Publication Data

US 2009/0085618 A1    Apr. 2, 2009

(51) Int. Cl.
    *H03L 7/06* (2006.01)
(52) U.S. Cl. .................................. 327/158; 327/149
(58) Field of Classification Search .................. 327/142, 327/149, 158
    See application file for complete search history.

(56) References Cited

U.S. PATENT DOCUMENTS

| 6,212,398 | B1 * | 4/2001 | Roberts et al. ............... 455/502 |
| 6,408,396 | B1 * | 6/2002 | Forbes ......................... 713/323 |
| 6,738,914 | B2 * | 5/2004 | Christopher ................. 713/323 |
| 7,184,799 | B1 * | 2/2007 | Jin et al. ...................... 455/574 |
| 7,307,900 | B2   | 12/2007 | Salmon |

* cited by examiner

*Primary Examiner*—Hai L Nguyen
(74) *Attorney, Agent, or Firm*—Erik R. Nordstrom

(57) ABSTRACT

Disclosed herein is a wake-up circuit for a bias input of a circuit such as a slave DLL circuit, to allow it to be placed in a reduced power mode and be "awoken" (brought up to a control bias level) in a sufficiently small enough amount of time. The wake-up circuit couples a bias input node to a voltage level that is higher then the control bias level in response to a wake-up event, and then it couples the control bias node to the bias input node in response to their voltage levels being sufficiently close to one another.

10 Claims, 2 Drawing Sheets

WAKE-UP CIRCUIT

BACKGROUND

With reference to FIG. 1, master-slave type delay locked loops (DLLs) generally use two primary components, a master DLL 102 and at least 1 slave DLL 108. The Master DLL locks to a certain delay for a given reference clock (Ref Clk) and communicates the delay information to the slave DLL 108 via a Control Bias voltage signal generated by a replica bias generator circuit 104. The slave DLL then generates an output signal (Output) based on an applied input (Input) signal delayed by an amount corresponding to the Control Bias signal. Copies of the bias signal, which carry the Master DLL's delay information, may be sent to various other slave DLLs to control their delay characteristics to mimic those of the master.

Master and slave DLLs can be configured in a variety of different ways. For example, a master DLL (such as master DLL 102) may comprise a phase-frequency detector, a charge pump, a loop filter, and a programmable voltage controlled delay line (VCDL), coupled as is commonly known, to generate a clock with desired delay characteristics from an applied reference clock (Ref Clk) and a self-generated feedback clock (Feedback Clk). Likewise, a suitable slave DLL to work in cooperation with the master DLL may include its own VCDL, along with a phase interpolator for added granularity.

The replica bias generator circuit 104 generates a replica of a bias signal (internal to the master DLL) used to control the master DLL circuit's VCDL. This replica bias signal (Control Bias) is provided to the slave VCDL (by way of a pass transistor M1 and wake up circuit 110 as a Slave Bias signal) to control the delay of the signal applied to the slave DLL 108 in accordance with the desired delay that is generated at the master DLL circuit 102. (Note that the bias generator or replica bias generator may actually be part of the master DLL, providing the bias signal to both the master and slave DLLs, or alternatively, as is shown in FIG. 1, it may be a separate circuit to replicate, or create a suitable derivation of, a bias signal generated from the master DLL circuit.

A slave DLL is considered to be on and consume power when it is biased, i.e., when a voltage is applied at its Slave Bias input. Usually, the slaves contain a large amount of capacitance on their bias inputs due to the loading gate capacitance and extra capacitors that are commonly added for noise immunity. This large capacitance can cause the slave to require a substantial amount of time (e.g., on the order of 100 ns) to charge up and settle for normal operation. In many applications, this large time factor limits how often the slaves could be powered down and thus inhibits putting them into a low power state in order to reduce power consumption. For example, with double data rate (DDR) memory interface applications, slave DLLs are used to delay the DQS (data strobe) signal from the memory to widen the read eye during read mode. The time between initiating a READ and when the strobe signal from the memory reaches the slave circuit is on the order of 10-20 nS. Thus, the 100 nS time required to power up a slave is too long for it to be in a power down mode and then be awoken when a read operation is initiated.

Accordingly, wake-up circuits such as wake-up circuit 110 are employed to more quickly charge up the slave circuit 108 so that it can be powered down and re-started in a sufficiently small amount of time. Wake-up circuit 110 comprises comparator U1 and pull-up transistor M2 coupled to the master and slave circuits as shown. In operation, during a powered down mode (master DLL 102 remains on), the Active Slave signal is de-asserted so that M1 is off, and the Wake-up signal is also de-asserted to disable U1. U1 is configured to output a High value when it is disabled. Thus, during the powered down mode, the Control Bias signal is decoupled from the Slave Bias input, which charges down.

When the slave circuit 108 is to be activated, the Wake-up signal is asserted to activate comparator U1. The Control Bias signal will be higher than the Slave Bias signal, so comparator U1 outputs a low and turns on pull-up transistor M2. This causes the Slave Bias node to charge up more quickly than it would if it were simply coupled to the Control Bias signal through pass gate M1. The comparator keeps the pull-up transistor M2 on until the Slave Bias level reaches the level of the Control Bias signal, whereupon U1 outputs a high level and turns off M2. The controller 106 is configured so that the Active slave signal asserts and the Wake-up signal de-asserts at a set time to coincide with this occurrence.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Unfortunately, it has been appreciated that it is difficult to control the Active Slave and Wake-up signals to assert and de-assert, respectively, at an appropriate time on a consistent basis. That is, the time for charging a slave circuit may vary over time for a given chip and/or vary from one chip to another. This is problematic because if M2 is turned off and M1 is turned on too quickly, then the slave will take longer to charge. On the other hand, if M1 is not turned on fast enough and U1 is left enabled for too long, the output of U1 may overshoot and the Slave Bias may be charged too much and require additional time to equalize with the Control Bias signal. Accordingly, a solution to this problem is disclosed herein.

Figure 1:
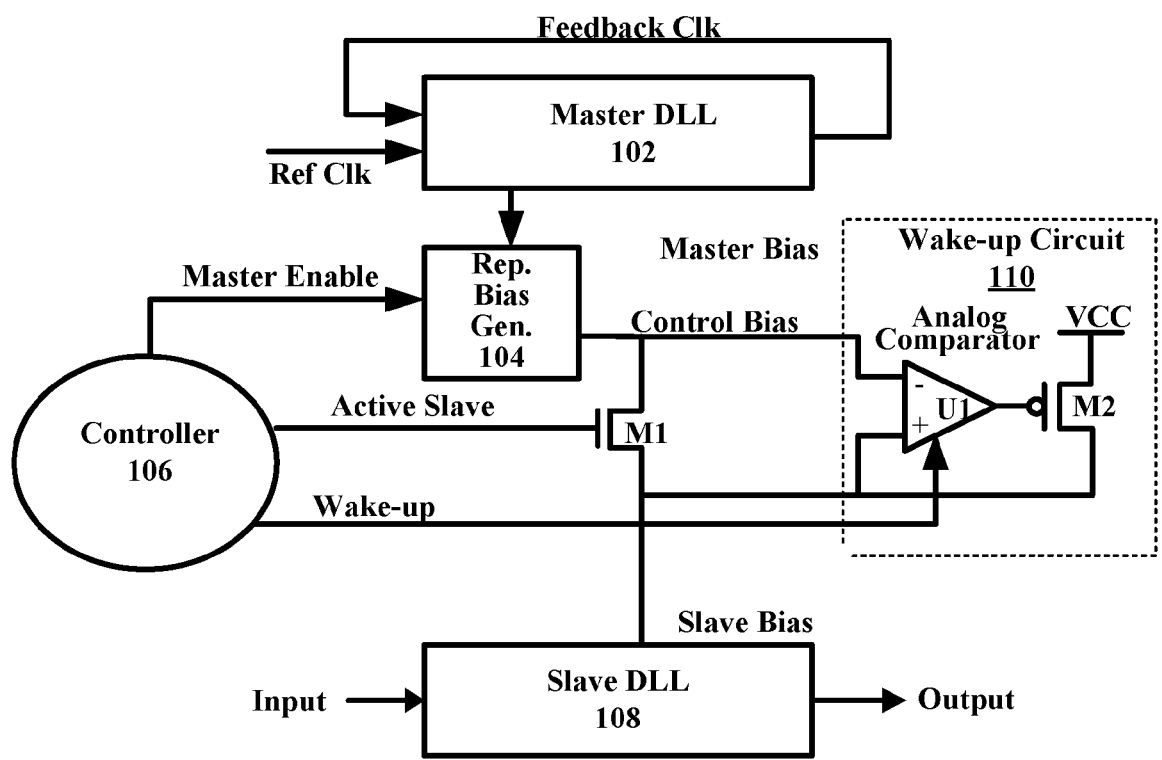
FIG. 1 is a schematic diagram of a conventional master-slave DLL circuit.
Figure 2:
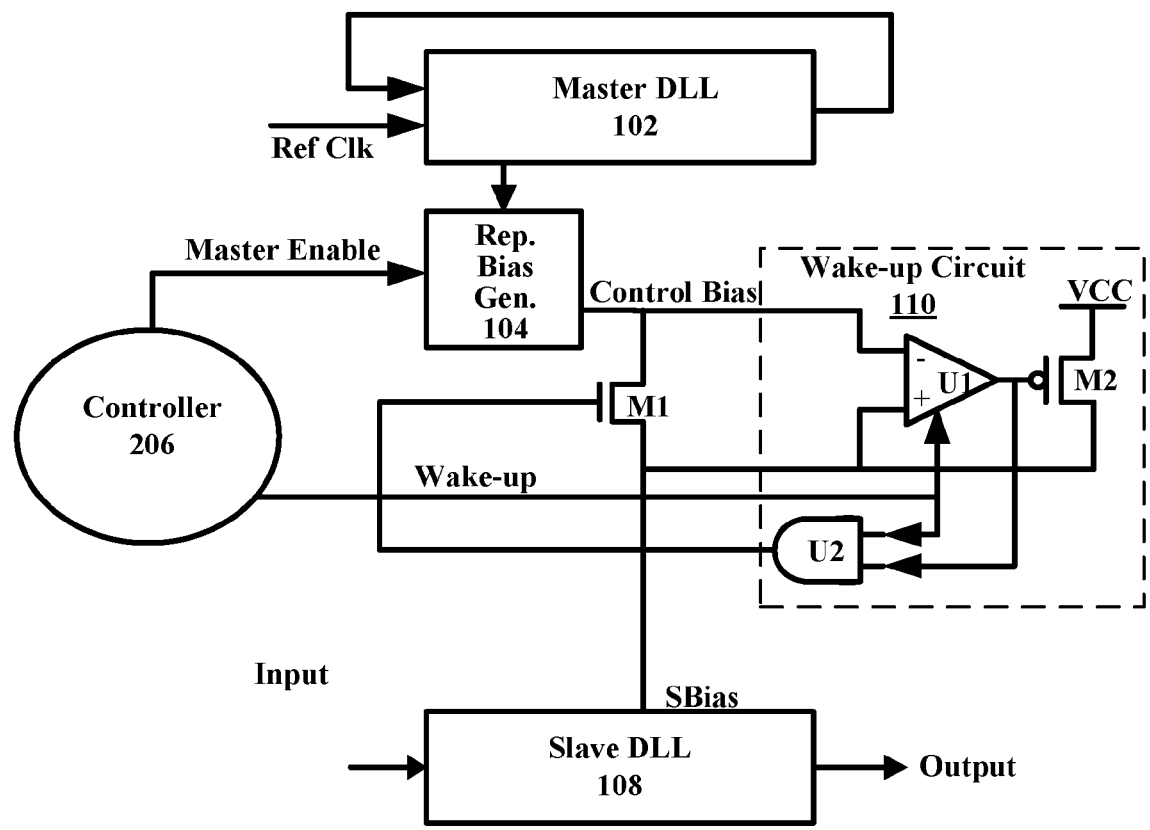
FIG. 2 is a schematic diagram of a master-slave DLL circuit with a wake-up circuit in accordance with some embodiments.

FIG. 2 shows the master-slave circuit of FIG. 1 but with an improved wake-up circuit 210. Wake-up circuit 210 comprises the comparator U1 and pull-up transistor M2, along with AND gate U2, all coupled together as shown. One of the AND gate inputs comes from a Wake-up signal, while the other one comes from the output of the comparator U1. The output of the AND gate U2 is applied to the gate of the pass gate transistor M1 to control whether it is on or off.

With the AND gate, coupled as shown, the pass gate M1 is controlled to turn on in response to the comparator going high, which occurs when the Slave Bias comes up to the level of the Control Bias signal. In operation, when the slave circuit 108 is in a reduced power mode, the wake-up signal will be de-asserted, which causes U1, M1, and M2 to be off and thus the Slave Bias input of the slave circuit to be discharged. When the slave is powered on, the Wake-up signal is asserted, which causes U1 to be activated.

When the comparator comes up, the Control Bias signal will be higher than Slave Bias, so the comparator output goes low, turning on the pull-up transistor M2. This causes the Slave Bias node to quickly charge up to the level of the Control bias signal. When it reaches the level of Control Bias, the comparator outputs a high causing M2 to turn off and the AND gate U2 to assert (high). This turns on M1 to couple the Slave Bias node to the Control Bias signal from the master circuit 102. At this point, the Slave Bias level may actually be higher than the Control Bias due to delay in the circuit, so turning on M1 not only couples the Control Bias to the Slave Bias, but also, it quickly forces the Slave Bias and Control bias levels to equal out.

In some embodiments, provisions may be made to disable the comparator when the pass gate M1 turns on. This is because when M1 turns on, the Control Bias level will be equal to or greater than Slave Bias (due to the albeit tiny drop across M1), which may cause the comparator's output to toggle, along with M2. For example, the controller 206 could be configured to de-assert the Wake-up signal when the output from U2 asserts. Alternatively, the comparator could be provided with hysteresis so that it doesn't toggle after turning off M2.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A DLL circuit, comprising:
a wake-up circuit to couple a bias input node to a voltage level that is higher then a control bias node in response to a wake-up event and to couple the control bias node to the bias input node in response to their voltage levels being sufficiently close to one another, the wake-up circuit comprising a comparator with inputs coupled to the bias input node and control bias node and an output coupled to a pull-up transistor, a pass gate coupled between the bias input node and control bias node, and a logic gate coupled between the comparator output and the pass gate to turn on the pass gate when the voltage levels at the bias input and control bias nodes are sufficiently close.

2. The DLL circuit of claim 1, in which the logic gate is an AND gate.

3. The DLL circuit of claim 1, in which the pull-up transistor is a PMOS transistor.

4. The DLL circuit of claim 1, in which a wake-up signal is coupled to the logic gate to turn off the pass gate for a power down mode.

5. The DLL circuit of claim 1, in which the control bias node comes from a bias replica circuit that replicates a bias signal of a Master DLL circuit.

6. A DLL circuit, comprising:
a master DLL circuit to provide a control bias signal to control a slave circuit through a slave bias node; and
a wake-up circuit having (i) a comparator with inputs coupled to the control bias signal and the slave bias node, the comparator having an output coupled to a pull-up transistor, (ii) a pass gate coupled between the control bias signal and slave bias node, and (iii) a logic gate coupled between the comparator output and the pass gate to turn on the pass gate when the voltage level of the control bias signal is sufficiently close to the voltage level at the slave bias node.

7. The DLL circuit of claim 6, in which the logic gate is an AND gate.

8. The DLL circuit of claim 6, in which the pull-up transistor is a PMOS transistor.

9. The DLL circuit of claim 6, in which a wake-up signal is coupled to the logic gate to turn off the pass gate for a power down mode.

10. The DLL circuit of claim 6, in which the control bias signal comes from a bias replica circuit that replicates a bias signal of a Master DLL circuit.

* * * * *